United States Patent [19]

Wen et al.

[11] Patent Number: 5,039,891
[45] Date of Patent: Aug. 13, 1991

[54] PLANAR BROADBAND FET BALUN

[75] Inventors: Cheng P. Wen, Mission Viejo; Wing Yau, Torrance, both of Calif.

[73] Assignee: Hughes Aircraft Company, Los Angeles, Calif.

[21] Appl. No.: 453,876

[22] Filed: Dec. 20, 1989

[51] Int. Cl.$^5$ .......................... H03K 1/16; H03F 3/45
[52] U.S. Cl. .................... 307/529; 307/262; 333/25; 328/160
[58] Field of Search ............... 307/529; 328/160, 158, 328/14; 333/218, 25, 124; 330/116, 117

[56] References Cited

U.S. PATENT DOCUMENTS

| | | | |
|---|---|---|---|
| 3,716,730 | 2/1973 | Cerny, Jr. | 307/529 |
| 3,863,136 | 1/1975 | Hanson | 307/529 |
| 4,308,473 | 12/1981 | Canes | 307/529 |
| 4,712,024 | 12/1987 | McGuire et al. | 307/529 |
| 4,814,649 | 3/1989 | Young | 307/529 |
| 4,841,169 | 6/1989 | Tsironis | 307/529 |
| 4,845,389 | 7/1989 | Pyndiah et al. | 307/529 |
| 4,994,755 | 2/1991 | Titus et al. | 330/275 |

Primary Examiner—Stanley D. Miller
Assistant Examiner—Richard Roseen
Attorney, Agent, or Firm—Terje Gudmestad; Jeannette M. Walder; Wanda K. Denson-Low

[57] ABSTRACT

Three active FET baluns, using resonant, reactive and resistive/reactive compensation are disclosed suitable for monolithic implementation. A single balanced mixer configuration including a resistive/reactive active FET balun coupled with a pair of single ended FET mixers in a push pull configuration is disclosed which is also suitable for monolithic implementation.

18 Claims, 3 Drawing Sheets

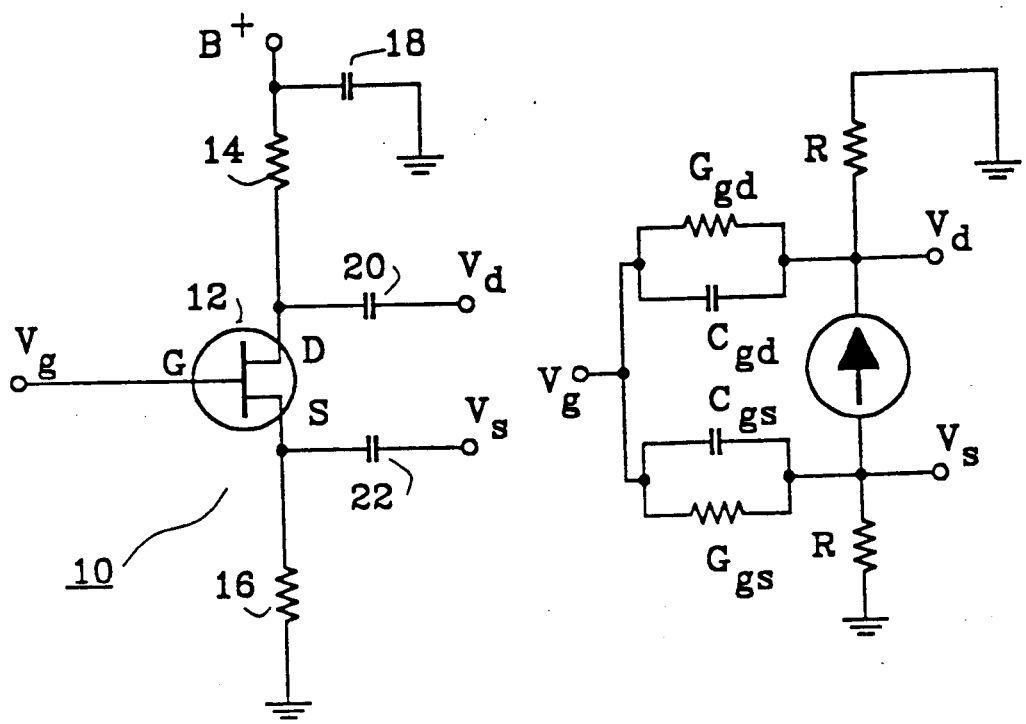
*Fig. 1a*   PRIOR ART   *Fig. 1b*
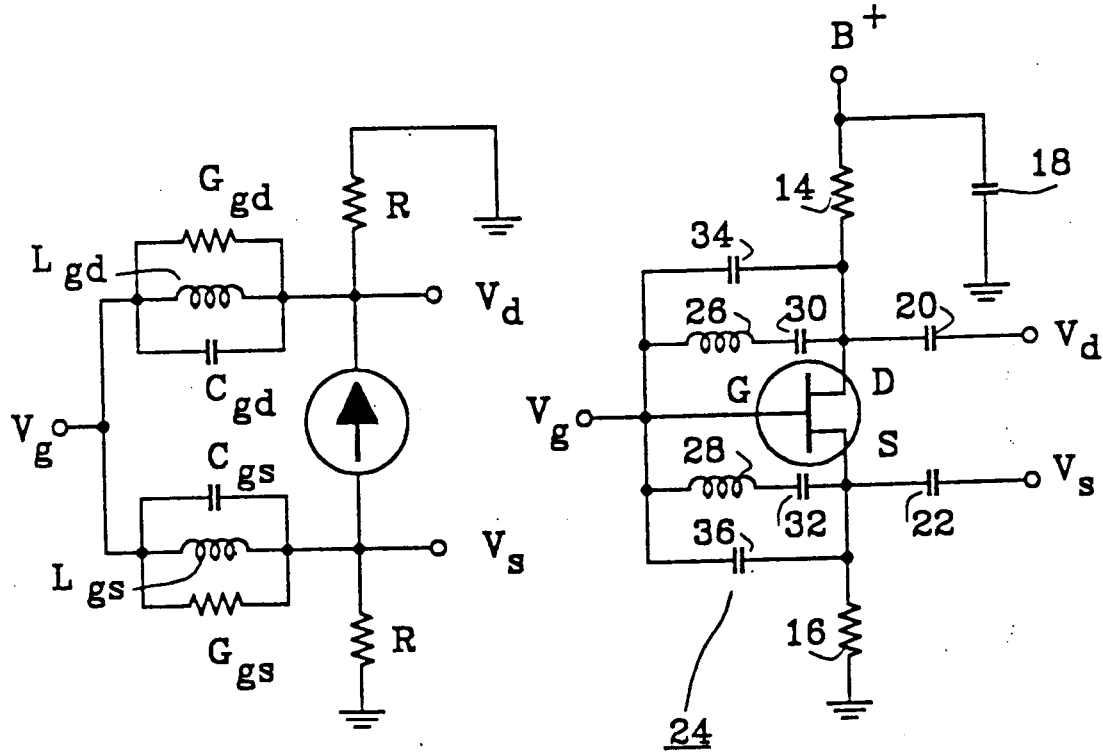
*Fig. 2*   *Fig. 3*

PLANAR BROADBAND FET BALUN

BACKGROUND OF THE INVENTION

1. Field of the Invention

This invention relates to electronic balun and mixing circuits and particularly to circuits designed for implementation with planar monolithic integrated circuit technology. This invention specifically relates to balanced mixers useful in radio frequency receiver systems, particularly rf, microwave and millimeter-wave frequency receivers.

2. Description of the Prior Art

Balanced mixers are required in many devices. When used in microwave receiver system applications, balanced mixers require wide dynamic range, low intermodulation products and effective local oscillator (Lo) AM noise suppression. A balanced mixer consists of two key subcomponents: a balun for achieving 180° phase split and a frequency mixer for combining the input signals to create an IF or intermediate frequency signal. In an ideal balanced mixer, the output signals include only the sum and difference frequencies, that is, a pair of signals equal to the sum and to the difference in input frequencies.

Conventional balanced mixers commonly employ passive baluns configured from many different devices for providing the 180° phase splitting, such as directional couplers, magic T's, rat race couplers, overlapped broadside couplers, Fin lines or even simply from a combination of an in-phase power splitter with unequal transmission lines. Such conventional baluns are limited by relatively large physical size, often approximately one half-wavelength long to obtain the 180° phase shift, and relatively narrow bandwidths, usually less than a full octave in range. These limitations make such conventions designs undesirable for use in monolithic structures.

SUMMARY OF THE INVENTION

The preceding and other shortcomings of the prior art are addressed and overcome by the present invention that provides circuitry suitable for monolithic implementation, which in a first aspect is a balun circuit including an active three terminal device and means for compensating the active device to provide a pair of equal magnitude outputs substantially 180° out of phase within an operating bandwidth.

In one implementation, the present invention provides a balun circuit with resonant compensation including inductance between the input and each output terminal to resonate with stray capacitance there between at frequencies within the operating bandwidth.

In another implementation, the present invention provides a balun circuit with reactive compensation including reactance between an output terminal and ground.

In another implementation, the present invention provides a balun circuit with reactive/resistive compensation including load impedances having an impedance ratio sufficient to substantially balance the magnitude of the balun output signals and compensating reactance in series with an output terminal to balance the phase shift between balun output signals to substantially 180°.

In another aspect, the present invention provides a balanced mixer circuit including an active balun with resistive/reactive compensation and a resistive mixer connected thereto.

BRIEF DESCRIPTION OF THE DRAWINGS

FIG. 1a is a schematic circuit representation of a prior art active FET balun. FIG. 1b is the equivalent circuit representation of the circuit of FIG. 1a.

FIG. 2 is an equivalent circuit representation of a resonant compensated active FET balun according to the present invention.

FIG. 3 is an equivalent circuit representation of a compact resonant compensated active FET balun according to the present invention.

DETAILED DESCRIPTION OF THE PREFERRED EMBODIMENT(S)

Figure 5:
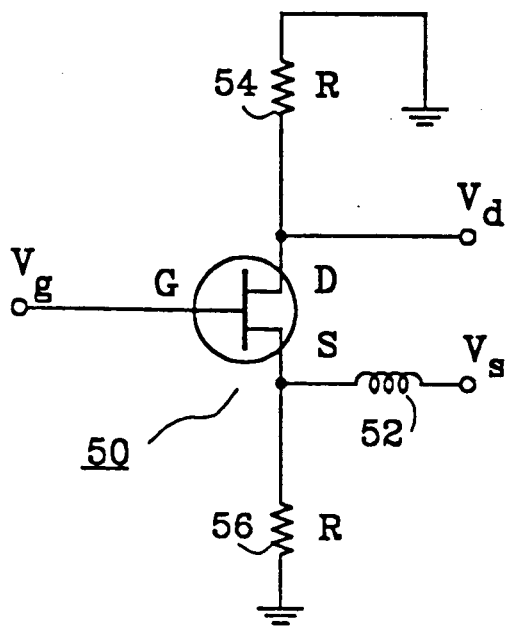
FIG. 5 is a schematic representation of a resistive/reactive compensated active FET balun circuit according to the present invention.

Three different circuits for field effect transistor (FET) based microwave active baluns suitable for monolithic implementation will be described first, followed by an FET based single balanced mixer combining a resistive mixer and one of the active balun configurations.

Active baluns made from FET devices can be configured in three basic designs according to the present invention: resonant baluns and baluns with reactive and resistive/reactive compensation.

FIG. 1 are schematic and equivalent circuit representations of a simple active FET balun. FIG. 1a shows active FET balun 10 including FET 12 with equal load impedances shown as resistive loads 14 and 16, connected between FET drain and B+ power and between FET source and ground connections, respectively. Bypass capacitors 18, 20, and 22 are used in a conventional manner at the B+, drain and source connections. Input signal $V_g$ is applied to the FET gate terminal and output signals $V_d$ and $V_s$ are available at bypass capacitors 20 and 22, respectively.

FIG. 1b shows the equivalent circuit for FIG. 1a from which the following equations for output signals $V_d$ and $V_s$ can be taken:

$$V_s = \frac{V_g R (g_m + j\omega C_{gs} + G_{gs})}{1 + (G_{gs} + j\omega C_{gs})R + g_m R}, \text{ and} \quad (1)$$

$$V_d = \frac{V_g R}{1 + (G_{gd} + j\omega C_{gd})R} \cdot \quad (2)$$

$$\left( \frac{-g_m + (G_{gd} + j\omega C_{gd})[1 + R g_m + (G_{gs} + j\omega C_{gs})R]}{1 + (G_{gs} + j\omega C_{gs})R + g_m R} \right)$$

The condition of a near perfect balun, that is, when the outputs are equal in magnitude and exactly 180° out of phase occurs when $V_s$ equals $-V_d$. As can be seen from equations (1) and (2), this condition may be achieved at low frequencies when the term $j\omega C_{gs}$ is much less than $g_m$ and $j\omega C_{gd}R$ is much less than 1 because $G_{gd}R$ and $G_{gs}R$ are usually negligible compared to one for a typical FET.

The phase angle between output signals $V_d$ and $V_s$ will deviate significantly from the ideal value of 180° as operating frequency $\omega$ increases. The following example is given to illustrate the problem. A typical 25 μm x .60 μm gate high electron mobility FET was selected with the following device parameters:

$$g_m \simeq 20 \times 10^{-3} S,$$

$$C_{gs} \simeq 10^{-13} F, \text{ and}$$

$$C_{gd} \simeq 5 \times 10^{-15} F.$$

The phase angle between output signals $V_d$ and $V_s$ in a circuit as shown in FIG. 1a was 160° with an amplitude unbalance of approximately 10%. This type of deviation from the ideal balun operating condition will lead to poor third order intermodulation product suppression characteristics when used as a balanced mixer.

The problems associated with the stray capacitances $C_{gs}$ and $C_{gd}$ can be reduced by the addition of parallel resonance inductances $L_{gs}$ and $L_{gd}$ to an active balun circuit as shown in the equivalent circuit representation in FIG. 2. The values for the parallel inductors $L_{gs}$ and $L_{gd}$ as selected so that the resultant capacitor/inductor tank circuits resonate at the operating frequency $\omega$, of the local oscillator. This permits a simplification of equations (1) and (2) so that the expressions for the output signals become:

$$V_s = \frac{V_g R (g_m + G_{gs})}{1 + RG_{gs} + g_m R}, \text{ and} \quad (3)$$

$$V_d = \frac{V_g R (-g_m + G_{gd}(1 + Rg_m + RG_{gs}))}{1 + G_{gs}R + g_m R}. \quad (4)$$

An active balun with resonant compensation configured in accordance with FIG. 2 will operate at frequencies well into the millimeter wave frequency range. Changes in transistor gain, or transconductance, due to aging or variations in ambient temperature will not cause deterioration in balun performance because the output signals are derived from a single current source. AM noise from the input signal is suppressed if the FET is gain saturated. This is particularly important when the balun is employed to drive a balanced mixer.

The resonant balun circuit described by the equivalent circuit of FIG. 2 can easily be achieved with GaAs monolithic integrated circuit fabrication techniques. A preferred embodiment for such a device is shown in FIG. 3 which provides a substantial reduction in circuit size compared to a direct implementation of the equivalent circuit shown in FIG. 2 at a cost of reduced bandwidth.

In FIG. 3, resonant compensated active FET balun 24 is configured from convention active FET balun 10 by the addition of inductors 26 and 28 connected between gate and drain and gate and source of FET 12 by bypass capacitors 30 and 32, respectively, to provide inductances $L_{gd}$ and $L_{gs}$ as shown in the equivalent circuit in FIG. 2. In addition, in order to further reduce the necessary circuit size, additional capacitors 34 and 36 are added in parallel with stray capacitances $C_{gd}$ and $C_{gs}$. This permits a substantial reduction in the needed inductance, and therefore the size of inductors 26 and 28 necessary to maintain the designed resonant frequency, at the cost of a somewhat narrower bandwidth.

Figure 4A:
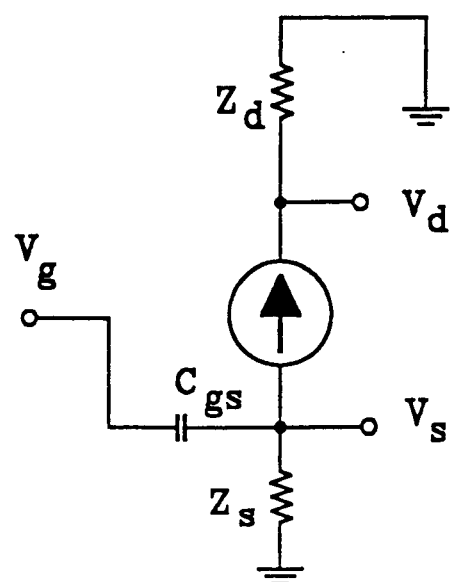
FIG. 4a is the equivalent circuit representation of an active balun according to the invention.

FIG. 4a shows the simplified equivalent circuit of an active balun. In FIG. 4a, to simplify the mathematical manipulations, the following assumptions are made. $G_{gd}$ and $G_{gs}$ are neglected because of their small intrinsic values and $C_{gd}$ is neglected because it is substantially smaller than $C_{gs}$. This permits a simplification of equations (1) and (2) using nodal analysis so that the expressions for the output signals become:

$$V_s = (V_g - V_s)(j\omega C_{gs} + g_m)Z_s, \text{ and} \quad (5)$$

$$V_d = -g_m Z_d \frac{V_s}{(j\omega C_{gs} + g_m)Z_s}. \quad (6)$$

To achieve the condition of a near perfect balun, that is, having output signals equal in magnitude and 180° out of phase, output signal $V_d$ is set to equal $-V_s$, resulting in the following equations, in which $Z_s$ and $Z_d$ are the source and drain termination loads and are assumed to be resistive loads equal to R:

$$Y_s = \frac{j\omega C_{gs}}{g_m} Y_d + Y_d, \quad (7)$$

$$Z_d = \frac{j\omega C_{gs} R}{g_m} + R. \quad (8)$$

Figure 4B:
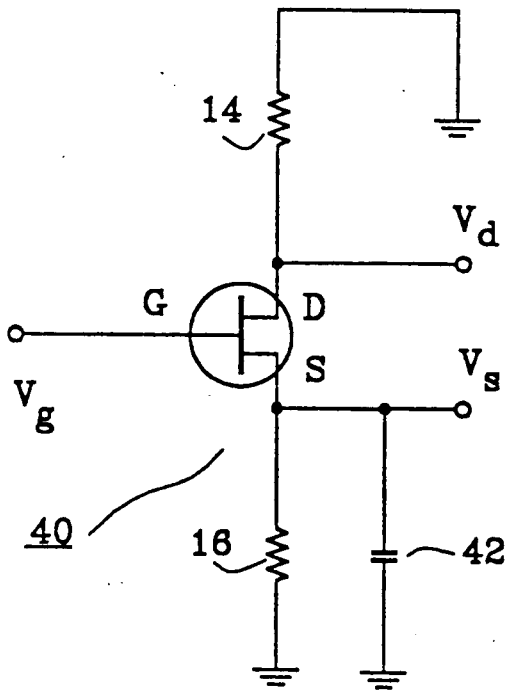
FIG. 4b is a schematic circuit representation of a capacitive reactive compensated active balun according to the invention.

FIG. 4b shows capacitive reactive compensated active balun 40 in which the value of compensation capacitor 42 is:

$$C_{42} = \frac{C_{gs}}{g_m R}. \quad (9)$$

Capacitive reactive compensated active balun 40 had demonstrated phase balanced output signals $V_d$ and $V_s$ within about ±5 degrees of phase and an amplitude balance within ±1.5 dB within a bandwidth of 2 to 12 GHz. This circuit could, however, operate in a much wider bandwidth. Compensation capacitor 42 is the key component limiting the bandwidth performance of capacitive reactive compensated active balun 40 shown in FIG. 4b.

Figure 4C:
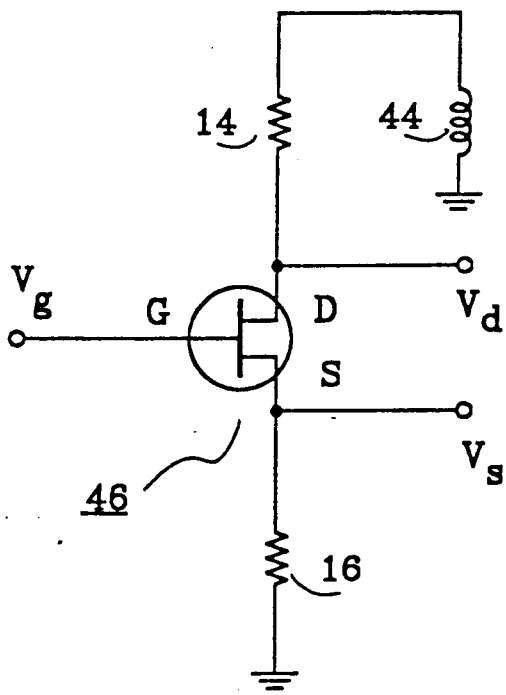
FIG. 4c is a schematic circuit representation of an inductive reactive compensated active balun according to the invention.

As shown in FIG. 4c, an alternative configuration of reactive compensation can be provided by replacing compensation capacitor 42 with compensation inductor 44 to provide inductance reactive compensated active balun 46 in which the value of compensation inductor 44 is:

$$L_{44} = \frac{C_{gs}}{g_m} R. \quad (10)$$

Both capacitive reactive compensated active balun 40 and inductance reactive compensated active balun 46, in addition to the benefits described above with regard to resonant compensated active FET balun 24, have the advantage that they can be implemented in hybrid or monolithic circuitry without modifying the active device structure and can be used with any three terminal active device. Although described with regard to resistive loading, this circuit approach can easily be extended to complex impedance loading.

The resonance and reactance compensation techniques discussed above with regard to FIGS. 3, 4b and c require an accurate description of the active device parameters. It is possible to develop a compensation scheme, discussed below with reference to FIG. 5, without such information. All that is required is an empirical description of device phase and magnitude characteristics at drain and source terminals.

The key limiting element in developing an ideal balun from a three terminal transistor device is $C_{gs}$, the gate-to-source capacitance. The higher this capacitance and the higher the operating frequency, the greater the deviation from the desired 180° output phase difference. However, since $C_{gs}$ varies linearly with frequency, as does the source drain phase difference, this linear relationship can be established empirically.

As shown FIG. 5, inductive microstrip transmission line 52, can be emploYed between the FET source terminal and the load to provide phase balance for reactive/resistive active FET balun 50. To compensate for output signal magnitude imbalance, resistive loading in the drain and source circuits can be used. The ratio of resistive values between drain resistor 54 and source resistor 56 is selected to provide output signal magnitude balance.

A circuit in accordance with the configuration of reactive/resistive active FET balun 50 has been demonstrated to provide an output phase balance on the order of 180°±10° and an amplitude balance on the order of ±1.0 dB across the majority of a 2 to 22 GHz bandwidth. In addition to the benefits discussed above with regard to other balun compensation techniques, drain and source resistors 54 and 56 of reactive/resistive active FET balun 50 serve as matching networks for the load, reduce the effect of load impedance on balun performance and can be used as a bias network for the three terminal device in the balun.

Figure 6:
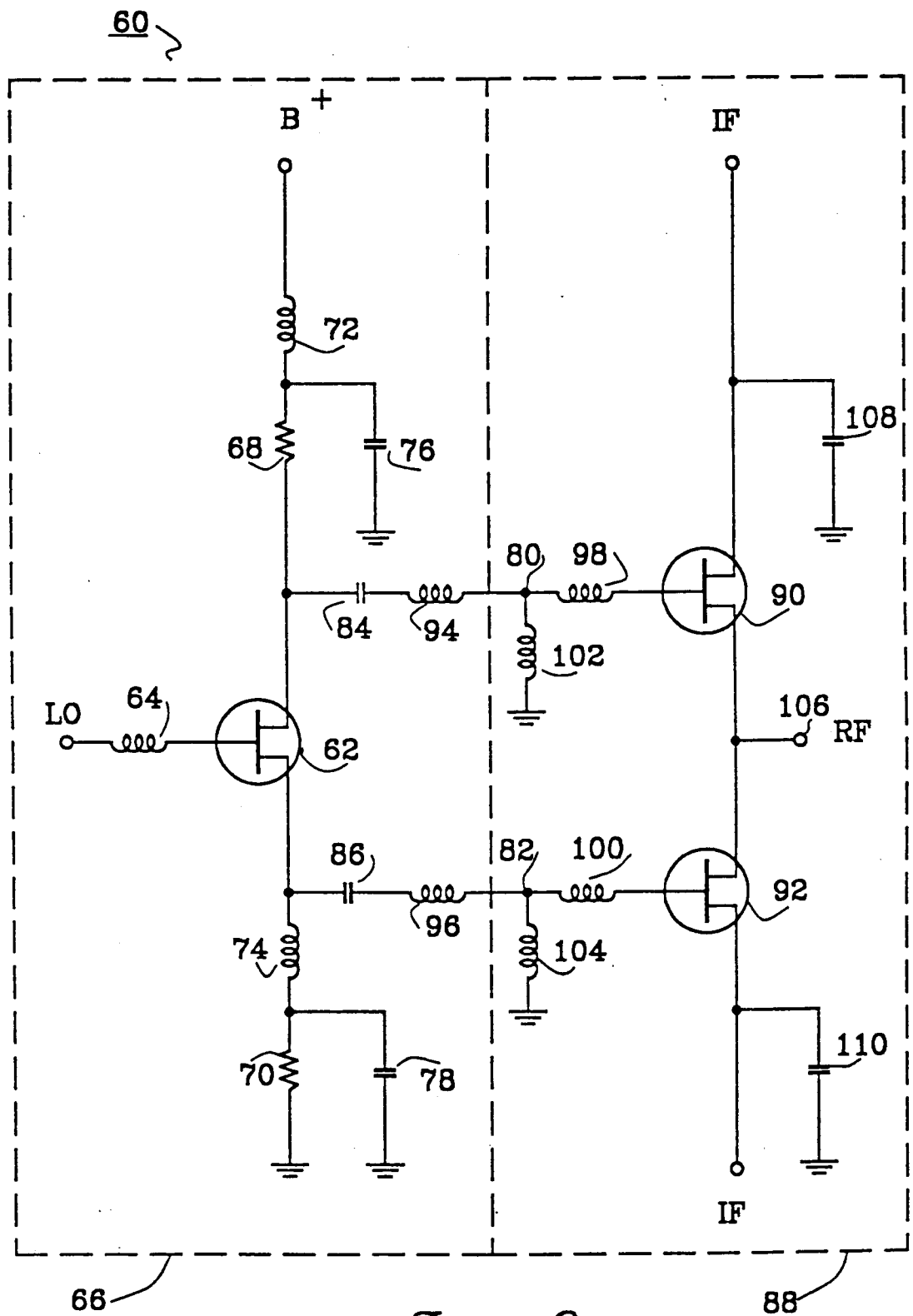
FIG. 6 is an FET based single balanced mixer suitable for monolithic implementation configured from an active balun using resistive/reactive compensation and an FET based resistive mixer, according to the present invention.

FIG. 6 shows single balanced mixer 60 configured with a reactive/resistive active FET balun similar to reactive/resistive active FET balun 50 shown in FIG. 5, together with a pair of single ended mixers connected in a conventional push pull configuration.

The local oscillator signal LO, from a source not shown, is applied to the gate terminal of balun FET 62 by 50 Ω input impedance 64 which may conveniently be a micro-strip transmission line. Balun FET 62 is configured as active FET balun 66 by the addition of 50 and 33 Ω drain and source inductive loads 68 and 70, 1 and 0.694 nH. drain and source inductive loads 72 and 74, as well as 3 pf. drain and source bypass capacitors 76 and 78 to provide output magnitude and 180° phase shift balance at drain and source output terminals 80 and 82 via 5 pf. bypass capacitors 84 and 86. The B+ power supply is connected to drain inductive load 72.

Balun output signals output signals $V_d$ and $V_s$ appearing at drain and source output terminals 80 and 82, respectively, are replications of the LO input signal, equal in magnitude and 180° out of phase. These balun output signals are applied to resistive mixer 88.

Resistive mixer 88 includes a pair of single ended mixers configured from mixer FET's 90 and 92 operated as a pair of single ended resistive mixers in a push-pull configuration. Mixer FET's 90 and 92 are connected to the output signals from active FET balun 66 by 50 Ω transmission lines 94 and 96, similar to input impedance 64, which are connected to the center tap of a pair of voltage dividers configured from 0.694 nH. inductors 98 and 100 between the center taps and the mixer FET gate terminals and 0.24 nH. inductors 102 and 104 between the center taps and ground. The source terminal of mixer FET 90 and the drain terminal of mixer FET 92 are connected together to form RF signal output 106. The intermediate mixing or IF frequency is applied to the drain terminal of mixer FET 90 and the source terminal of FET 92 which are provided with 5 pf. bypass capacitors 108 and 110.

Mixer FET's 90 and 92 are thereby modulated on and off by the equal but opposite amplitude LO signals generated by active FET balun 66 at terminals 80 and 82. These FET's act as switching resistors whose weakly nonlinear characteristics provide the mixing function with very low intermodulation products or other spurious responses. This technique is sometimes called resistive mixing.

The component values given above with respect to active FET balun 66 are provided by way of example and would be useful with 240μm and 120μm devices employed as active balun FET 62 and mixer FET's 90 and 92, respectively. A balanced mixer configured as described will provide improvements over conventional mixing schemes; particularly good port to port isolation, AM noise suppression, low intermodulation products and spurious response, compact size, good dynamic range, low LO drive requirements, and low DC power consumption in a configuration suitable for monolithic implementation.

While this invention has been described with reference to its presently preferred embodiment, its scope is not limited thereto. Rather, such scope is only limited insofar as defined by the following set of claims and includes all equivalents thereof.

We claim as our invention:

1. A balun circuit for hybrid monolithic implementation, comprising:
    an active monolithic device comprising an FET having a gate electrode, a source electrode and a drain electrode, wherein the gate is coupled to an input terminal and the source and drain electrodes are coupled to a pair of output terminals; and
    means for compensating the active device comprising a reactive impedance coupled between at least one of the source and drain and ground, wherein the reactive impedance is chosen such that the voltage at the source is equal in magnitude to the voltage at the drain and is substantially 180 degrees out of phase within an operating bandwidth.

2. The balun circuit of claim 1 wherein said compensating means comprises a first reactive impedance coupled between the source and ground and a second reactive impedance coupled between the drain and ground.

3. The balun circuit of claim 1 wherein the reactive impedance comprises an inductive reactance.

4. The balun circuit of claim 1 wherein the reactive impedance comprises a capacitive reactance.

5. The balun circuit of claim 1 further comprising a load impedance coupled between at least one of the source and drain and ground.

6. The balun circuit of claim 5 wherein the FET has characteristic stray capacitance and characteristic transconductance and the value of the reactive impedance is equal to the value of the stray capacitance divided by the product of the load impedance and the transconductance.

7. The balun circuit of claim 6 wherein in value of the reactive impedance is equal to the product of the stray capacitance and the load impedance divided by the transconductance.

8. A balun circuit for hybrid and monolithic implementation, comprising:
an active device comprising an FET having a gate electrode, a source electrode and a drain electrode, wherein the gate is coupled to an input terminal and the source and drain electrodes are coupled to a pair of output terminals; and
means for compensating the active device comprising a resonant impedance coupled between at least one of the source and drain and the gate, wherein the resonant impedance is chosen such that the voltage at the source is equal in magnitude to the voltage at the drain and is substantially 180 degrees out of phase within an operating bandwidth.

9. The balun circuit of claim 1 wherein said compensating means comprises a first resonant impedance coupled between the source and the gate and a second resonant impedance coupled between the drain and the gate.

10. The balun circuit of claim 1 wherein the resonant impedance comprises an inductive reactance.

11. The balun circuit of claim 1 further comprising a load impedance coupled between at least one of the source and drain and the gate.

12. A balanced mixer circuit for monolithic implementation, comprising a balun circuit wherein the balun circuit includes an active monolithic device comprising an FET having a gate electrode, a source electrode and a drain electrode, wherein the gate is coupled to an input terminal and the source and drain electrodes are coupled to a pair of output terminals; and means for compensating the active device comprising a reactive impedance coupled between at least one of the source and drain and ground, wherein the reactive impedance is chosen such that the voltage at the source is equal in magnitude to the voltage at the drain and is substantially 180 degrees out of phase within an operating bandwidth; and
a resistive mixer coupled to the output terminals.

13. The mixer circuit of claim 12 wherein said compensating means comprises a first reactive impedance coupled between the source and ground and a second reactive impedance coupled between the drain and ground.

14. The mixer circuit of claim 12 wherein the reactive impedance comprises an inductive reactance.

15. The mixer circuit of claim 12 wherein the reactive impedance comprises a capacitive reactance.

16. The mixer circuit of claim 12 further comprising a load impedance coupled between at least one of the source and drain and ground.

17. The mixer circuit of claim 16 wherein the FET has characteristic stray capacitance and characteristic transconductance and the value of the reactive impedance is equal to the value of the stray capacitance divided by the product of the load impedance and the transconductance.

18. The mixer circuit of claim 17 where in value of the reactive impedance is equal to the product of the stray capacitance and the load impedance divided by the transconductance.

* * * * *